US008023680B2

(12) United States Patent
Hayasaka et al.

(10) Patent No.: US 8,023,680 B2
(45) Date of Patent: Sep. 20, 2011

(54) MOUNTING BRACKET AND SPEAKER UNIT

(75) Inventors: Shinichi Hayasaka, Tendo (JP); Hiroyuki Kobayashi, Tendo (JP); Koji Takayama, Tendo (JP)

(73) Assignees: Pioneer Corporation, Tokyo (JP); Tohoku Pioneer Corporation, Yamagata (JP)

( * ) Notice: Subject to any disclaimer, the term of this patent is extended or adjusted under 35 U.S.C. 154(b) by 1338 days.

(21) Appl. No.: 11/602,387

(22) Filed: Nov. 21, 2006

(65) Prior Publication Data

US 2007/0154054 A1 Jul. 5, 2007

(30) Foreign Application Priority Data

Nov. 21, 2005 (JP) ................................ 2005-336377

(51) Int. Cl.
*H04R 1/02* (2006.01)
*H05K 5/00* (2006.01)

(52) U.S. Cl. ........ 381/386; 381/387; 381/388; 381/389; 181/150

(58) Field of Classification Search .......... 381/386–389; 181/150; 248/27.1
See application file for complete search history.

(56) References Cited

U.S. PATENT DOCUMENTS 6,061,460 A * 5/2000 Seo .............................. 381/388

FOREIGN PATENT DOCUMENTS

| | | | | |
|---|---|---|---|---|
| JP | 07016494 | A | * | 1/1995 |
| JP | 7-16494 | U | | 3/1995 |
| JP | 2004-120192 | A | | 4/2004 |
| JP | 2004120192 | A | * | 4/2004 |

* cited by examiner

*Primary Examiner* — Curtis Kuntz
*Assistant Examiner* — Sunita Joshi
(74) *Attorney, Agent, or Firm* — Sughrue Mion, PLLC

(57) ABSTRACT

The speaker unit 1 includes a speaker 2 and a mounting bracket 3. The mounting bracket 3 includes an attachment 16, a connecting part 17, and an elastic part 18. The attachment 16 is attached to the speaker 2. The connecting part 17 is linked with the attachment 16. The elastic part 18 is linked with the connecting part 17. A biting projection 23 and the interfering projection 24 are formed on the elastic part 18. The biting projection 23 and the interfering projection 24 project from the elastic part 18. The biting projection 23 bites an inner surface of a hole of a dashboard. The interfering projection 24 interferes with a projection formed on the inner surface of the dashboard, and is disposed at a deeper side of the hole than the projection.

7 Claims, 15 Drawing Sheets

MOUNTING BRACKET AND SPEAKER UNIT

CROSS REFERENCE TO RELATED APPLICATIONS

This application is based on Japanese Patent Application No. 2005-336377, the contents of which are hereby incorporated by reference.

BACKGROUND OF THE INVENTION

1. Field of the Invention

The present invention relates to a mounting bracket for mounting a speaker on a structure such as a vehicle or a ship, and to a speaker unit having the mounting bracket.

2. Description of the Related Art

Conventionally, a speaker unit is mounted on a vehicle or a ship. The speaker unit includes a speaker and a mounting bracket for mounting the speaker on a structure of such as an inner surface of a cabin of a vehicle.

Japanese published patent application No. 2004-120192 discloses a mounting bracket having a dome insertable into a hole mounted on a structure, and an elastic member attached to the dome. The dome includes a tubular main body having a bottom, and a flange. The main body integrally includes a plane bottom and a peripheral part extended vertically from an edge of the bottom. The flange is linked with an outer edge of the peripheral part away from the bottom, and extended outward from the outer edge.

The elastic member includes an attachment overlapped with the bottom for being attached to the bottom with a bolt and a nut, and an elastic piece linked with the attachment. The attachment is formed in a plane shape. One end of the elastic piece is linked with the attachment. When the attachment is attached to the bottom, the elastic piece extends from the bottom toward the flange. Further, as the elastic piece extends from the attachment to the flange, the elastic piece gradually extends toward an outer periphery of the dome. The elastic piece is elastic so that an end away from the attachment can touch the dome.

While the attachment is removed from the bottom by loosening the bolt and the nut, the dome with the elastic member is inserted into the hole in a manner the attachment and the bottom are removed from each other. Then, the elastic piece is once elastically deformed in a manner the end is close to the dome. Then, when the end goes into an inner edge of the hole, the elastic piece returns to the neutral position.

Then, the bolt and nut are fastened, the bottom and the attachment are stuck to each other, and an inner surface is caught between the flange and the elastic piece. Thus, the mounting bracket disclosed in Japanese published patent application No. 2004-120192 is mounted on the structure.

Japanese published utility model application No. H7-16494 discloses a mounting bracket attached to a cover mounted on the inner surface. The mounting bracket includes an attachment to be overlapped with the speaker and attached to the speaker, and an elastic piece linked with the attachment. The attachment is formed in a plate shape. One end of the elastic piece is linked with the attachment and extends from the attachment toward an outer periphery of the speaker. An end of the elastic piece away from the attachment is elastic to displace in a radial direction of the speaker.

The mounting bracket is mounted on the speaker and inserted into a cover. Then, the elastic piece is engaged with an inner surface of the cover so that the mounting bracket is mounted on the cover. Then, the cover is attached to the inner surface so that the speaker is fastened.

The mounting bracket disclosed in Japanese published patent application No. 2004-120192 requires fastening the bolt and the nut after the dome is inserted into the hole of the inner surface. Therefore, man-hours for mounting the speaker unit on the structure increase.

The mounting bracket disclosed in Japanese published utility model application No. H7-16494 is inserted into the cover and only engaged with the inner surface of the cover. Therefore, the mounting bracket is easy to be mounted. However, when disengaging the elastic piece, the mounting bracket falls out from the cover. Therefore, the mounting bracket disclosed in Japanese published utility model application No. H7-16494 is easy to fall out from the structure.

Accordingly, an object of the present invention is to provide a mounting bracket and a speaker unit having the mounting bracket that allows to be easily mounted on a structure and is prevented from falling out of the structure.

SUMMARY OF THE INVENTION

In order to attain the object, according to the present invention, there is provided a mounting bracket to be attached to a speaker, and inserted into a hole with the speaker for mounting the speaker on a structure, said mounting bracket including:

an elastic member to generate resiliency in a direction of expanding an inner surface of the hole when the elastic member is inserted into the hole;

a biting projection projected from the elastic member to bite the inner surface of the hole; and an interfering projection projected from the elastic member and disposed at a deeper side in the hole than a projection disposed on the inner surface of the hole to interfere with the projection.

These and other objects, features, and advantages of the present invention will become more apparent upon reading of the following detailed description along with the accompanied drawings.

DETAILED DESCRIPTION OF THE PREFERRED EMBODIMENT

Figure 1:
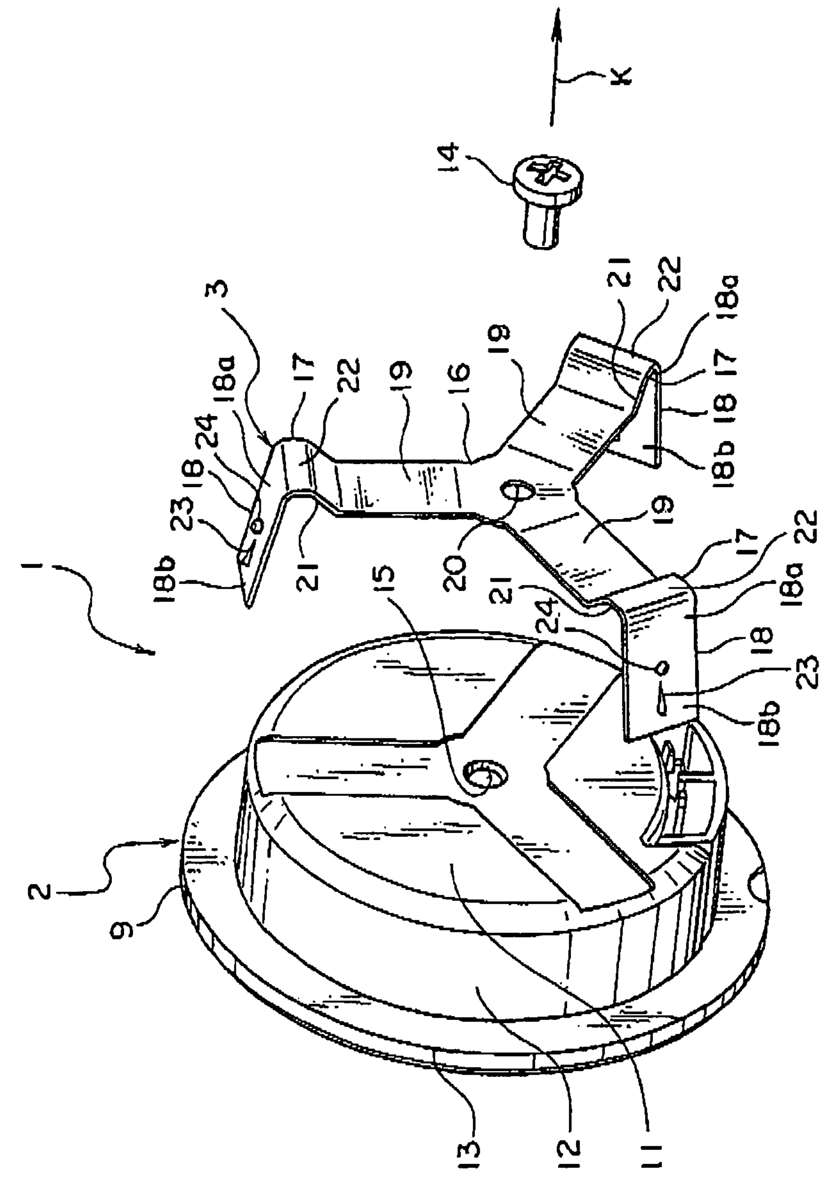
FIG. 1 is an exploded perspective view showing an embodiment of a speaker unit according to the present invention.
Figure 2:
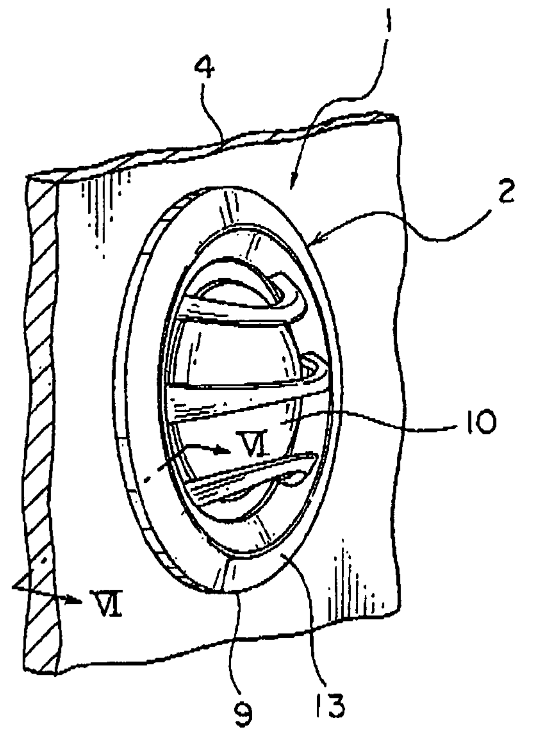
FIG. 2 is a perspective view showing the speaker unit of FIG. 1 mounted on a dashboard.

An embodiment of a mounting bracket and a speaker unit will be explained. Because the mounting bracket includes a biting projection projected from an elastic part for bite an inner surface of a hole, after the mounting bracket is attached to the speaker and inserted into the hole, the biting projection bites the inner surface of the hole, and the speaker is mounted on a structure.

Further, in the mounting bracket, an interfering projection mounted on the elastic part is positioned at a deeper side of the hole than a projection disposed on the inner surface of the hole. Therefore, when the elastic part is deformed in a direction of approaching the speaker, the resiliency of the elastic part presses the speaker toward the deeper side of the hole.

Thus, by inserting the mounting bracket attached to the speaker into the hole, the biting projection bites the inner surface of the hole, or the interfering projection is positioned at the deeper side of the hole than the projection disposed on the inner surface of the hole. Therefore, by inserting the mounting bracket attached to the speaker into the hole, the speaker is mounted on the structure.

Further, the mounting bracket allows the speaker to be mounted on both the structure having no projection on the inner surface of the hole and the structure having the projection on the inner surface of the hole. Therefore, the speaker can be mounted on various structures without increasing a variety of the mounting bracket.

Further, the biting projection may be formed in a taper shape so that a width of the projection gradually decreases as the projection extends an outer periphery of the speaker. In this case, the biting projection surely bites the inner surface of the hole, and the speaker is surely mounted on the structure.

Further, a flat surface may be formed on a rear end of the biting projection in a direction perpendicular to an insertion direction of the biting projection to the hole. In this case, once the biting projection is inserted into the hole, the flat surface catches the inner surface of the hole so that the speaker is surely prevented from falling out of the hole, namely, the structure.

The interfering projection may be formed in a taper shape so that a width of the interfering projection decreases as the interfering projection extends the outer periphery of the speaker. In this case, a surface of the interfering projection abutting on the inner surface of the hole is further inclined to the outer periphery of the speaker as the projection goes to the deep side of the hole. Therefore, the resiliency of the elastic part deformed toward the speaker surely presses the speaker toward the deeper side of the hole.

A slant surface may be formed on a rear end of the interfering projection in a direction of inserting the interfering projection into the hole. The slant surface is further inclined toward the outer periphery of the speaker as the interfering projection extends the deeper side of the hole. In this case, the slant surface abuts on a projection disposed on the inner surface of the hole. Therefore, the resiliency of the elastic part deformed toward the speaker surely presses the speaker toward the deeper side of the hole.

A connecting part for connecting an attachment of a speaker and the elastic part may be formed on the mounting bracket. A first connecting part extending from the attachment toward the deep side of the hole and a second connecting part extending from the first extending part toward the outer periphery of the speaker may be formed on the connecting part. Thus, the connecting part including the first and second connecting parts may be formed on the mounting bracket. In this case, a total length of the connecting part is longer than the connecting part directly connected to the elastic part. Therefore, even when a displacement of the elastic part is small, the resiliency of the elastic part is surely attained. Therefore, the elastic part more strongly presses the speaker toward the deep side of the hole, and the speaker is surely prevented from falling out of the structure.

A plurality of the elastic part may be formed on the speaker in a circumferential direction of the speaker. In this case, the biting projection and the interfering projection may be formed in the circumferential direction of the speaker. Therefore, a bitten position where the biting projection bites may be formed in the circumferential direction of the speaker, and the speaker is further prevented from falling out of the hole. Further, resiliency caused by interference between the interfering projection and the projection, namely, abutting force for the speaker toward the deep side of the hole is arranged at a plurality of positions, so that the speaker is further prevented from falling out of the hole.

The speaker unit may include the speaker and the mounting bracket described the above. In this case, because the speaker unit includes the speaker and the mounting bracket, the speaker is easily mounted on the structure, and the speaker mounted on the structure is prevented from falling out of the hole, namely, the structure.

Embodiment

Figure 3:
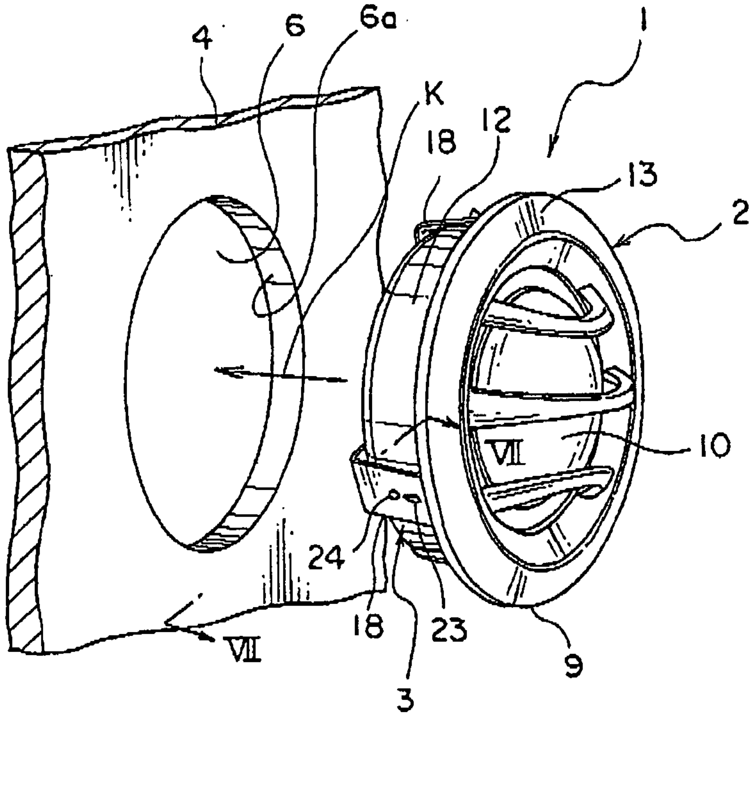
FIG. 3 is a perspective view showing the speaker unit of FIG. 2 removed from the dashboard.

An embodiment of the present invention will be explained with reference to FIGS. 1 to 21. As shown in FIGS. 1 and 3, the speaker unit 1 includes a speaker 2 and a mounting bracket 3, and is mounted on a dashboard 4, 5 (FIGS. 3 and 9) of a vehicle.

A hole 6 penetrates the dashboard 4 as shown in FIG. 3. A plan view of the hole 6 is a circle. An inner diameter of the hole 6 is a little smaller than an outer diameter of a later-described flange 13 of the speaker 2. Further, the inner diameter of the hole 6 is a little smaller than outer diameters of a plurality of later-described elastic parts 18, which are not deformed, of the mounting bracket 3. An inner surface **6*a* of the hole 6** is formed in a plane shape.

Figure 9:
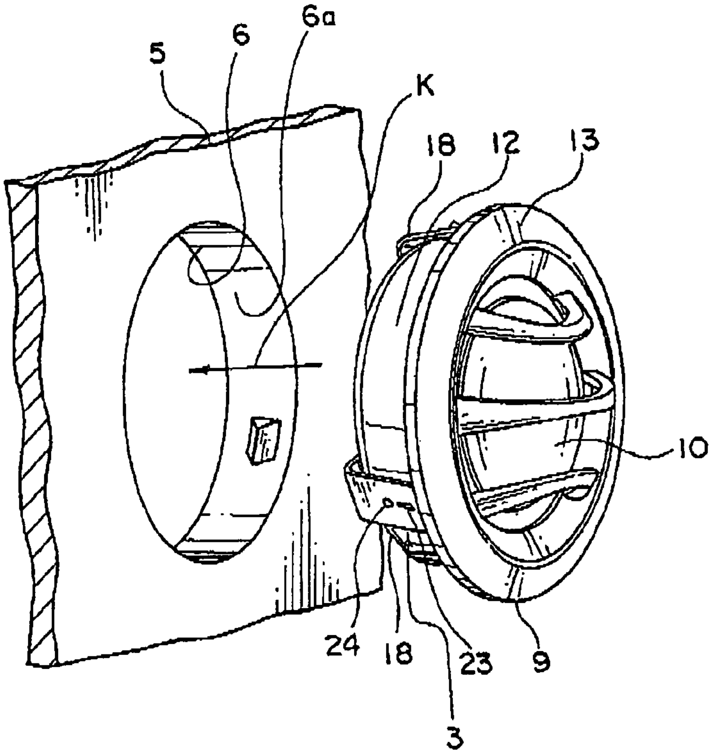
FIG. 9 is a perspective view showing the speaker of FIG. 2 and another dashboard.

Because a structure of the dashboard 5 shown in FIG. 9 is equal to that of the dashboard 4, same reference numerals are assigned on the same parts. A projection 7 is formed on the inner surface **6*a* of the hole 6 of the dashboard 5 shown in FIG. 9. The projection 7 is projected from the inner surface 6*a* toward an inside of the hole 6. When the speaker 2 on which the mounting bracket 3 is attached is inserted into the hole 6, the projection 7 abuts on the later-described elastic parts 18 of the mounting bracket 3**.

Figure 10:
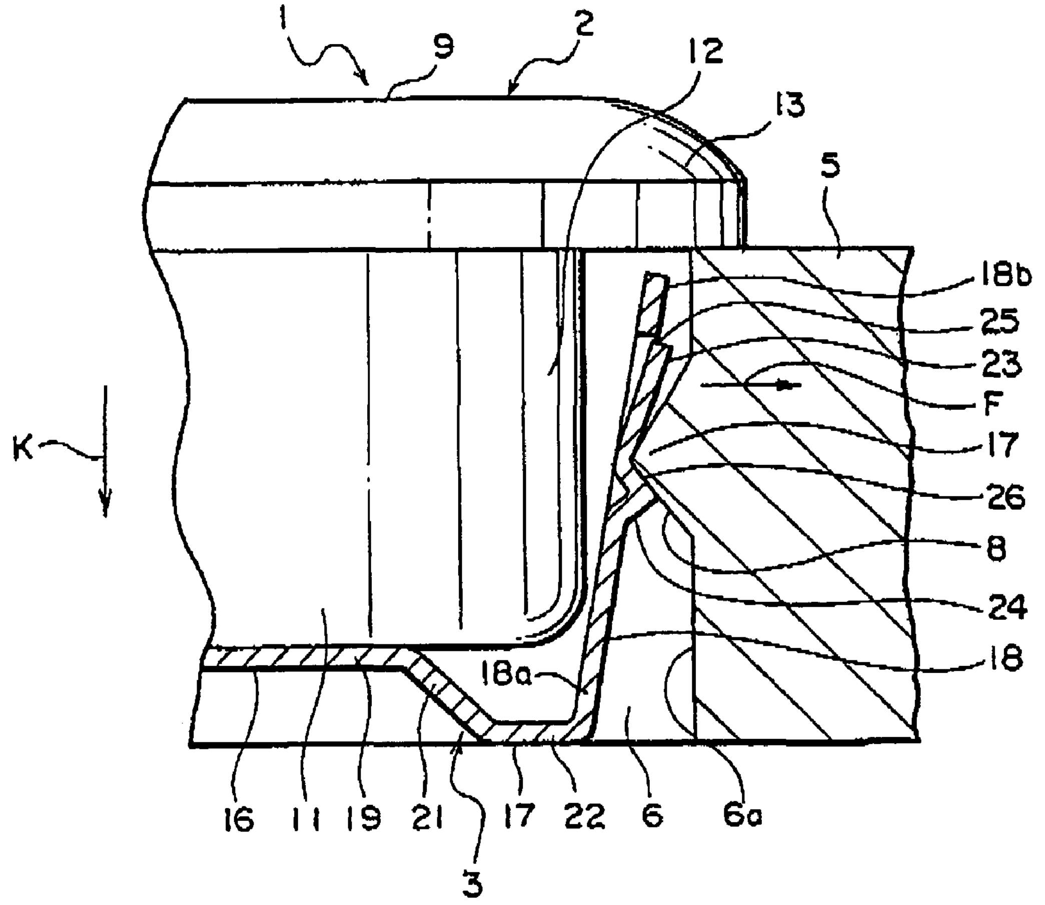
FIG. 10 is a sectional view showing the speaker of FIG. 9 mounted on another dashboard.

A slant surface 8 is formed in front of the projection 7 in a later-described insertion direction K. As shown in FIGS. 9 and 10, the slant surface 8 is gradually inclined in a direction of approaching the inner surface 6*a* against the insertion direction K, as the slant surface 8 extends the deeper side of the hole 6, namely a front side of the insertion direction K. A slant surface 26 of a later-described interfering projection 24 of the mounting bracket 3 attached to the speaker 2 inserted into the hole 6 is overlapped with the slant 8.

The speaker 2 includes an outer case 9 and a speaker main body 10 received in the outer case 9. As shown in FIG. 1, the outer case 9 includes a disk-shaped bottom plate 11, a cylindrical tubular portion 12 extended from an outer edge of the bottom plate 11, and a flange 13 linked with an edge of the tubular portion 12 away from the bottom plate 11. Outer diameters of the bottom plate 11 and the tubular portion 12 are a little smaller than the inner diameter of the hole 6. The flange 13 is formed in a ring shape, extended from the edge of the tubular portion 12 toward an outer periphery of the tubular portion 12. Further, a thread hole 15 where a thread 14 is screwed is formed on the bottom plate 11 of the outer case 9. The thread hole 15 is formed in the center of the bottom plate 11.

The speaker main body 10 includes a magnetic circuit and a diaphragm. When a sound signal is supplied to the speaker, the speaker oscillates the diaphragm and generates sound. The speaker main body 10 is received in the outer case 9 in a manner that the diaphragm is exposed through an opening surrounded by the edge of the tubular portion 12.

Figure 4:
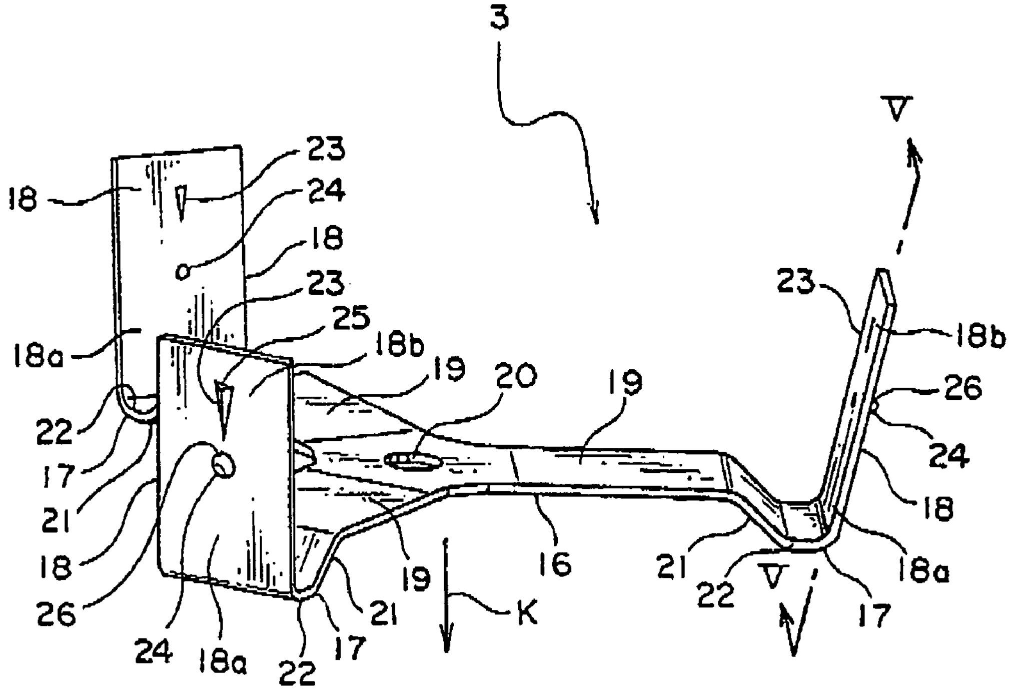
FIG. 4 is a perspective view showing a mounting bracket of the speaker unit shown in FIG. 1.
Figure 5:
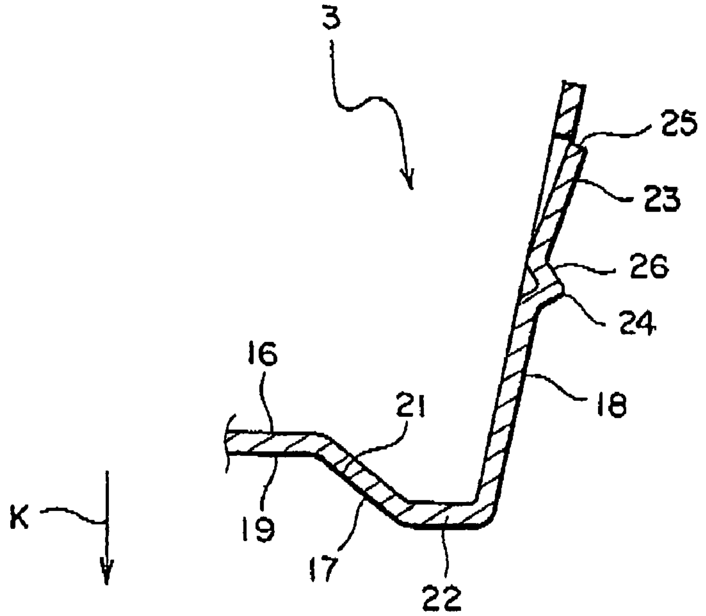
FIG. 5 is a sectional view taken on line V-V of FIG. 4.

Stamping or folding a metal plate forms the mounting bracket 3. As shown in FIGS. 4 and 5, the mounting bracket 3 integrally includes plate-shaped attachments 16, connecting parts 17, and elastic parts 18. In figures, three connecting parts 17 and three elastic parts 18 are shown.

The attachments 16 include a plurality of straight plates 19. In the figures, three straight plates 19 are shown. A plan view of the straight plate 19 is rectangular. One ends of the straight plates 19 are connected to each other, and the other ends of the straight plates 19 are arranged radially about the one ends. Namely, a length direction of the straight plate 19 is extended in a radial direction about the one ends. The other ends of the straight plates 19 are arranged at even intervals in a circumferential direction about the one ends. A hole 20 for passing the thread 14 penetrates through the one ends of the straight plates 19.

The connecting part 17 is linked with the other end of the straight plate 19 of the attachment 16. The connecting part 17 includes a first extending part 21 extending from the attachment 16 along the insertion direction K toward the deep side of the hole 6, and a second extending part 22 extending from the first extending part 21 toward the outer periphery of the speaker 2 and is linked with the elastic part 18.

A plan view of the elastic part 18 is in a rectangular belt shape.

One end 18*a* of the elastic part 18 is linked with a top end of the second extending part 22 of the connecting part 17. Namely, one straight plate 19, one connecting part 17, and one elastic part 18 are continued. As later described, when the mounting bracket 3 is attached to the speaker 2, the elastic part 18 extends from the connecting part 17 toward a rear side of the insertion direction K, namely, the flange 13 of the outer case 9 of the speaker 2.

Further, as the elastic part 18 extends from the one end 18*a* to the other end 18*b*, the elastic part 18 is gradually away from the speaker 2. The elastic part 18 and the connecting part 17 are elastically deformable so that the other end 18*b* can move close to and away from the speaker 2. Further, because a plurality of the elastic part 18 are linked with the other ends of the straight plates 19 via the connecting parts 17, the elastic parts 18 are arranged at even intervals in a circumferential direction about the one ends of the straight plates 19.

As shown in FIGS. 4 and 5, a biting projection 23 and an interfering projection 24 are formed on each elastic part 18. The biting projection 23 is mounted on the other end 18*b* of the elastic part 18, and projects from the elastic part 18 toward the outer periphery of the speaker 2. A part of the elastic part 18 is extruded toward the outer periphery of the speaker 2 to form the biting projection 23. In a plan view, the biting projection 23 is formed in a triangle shape.

The biting projection 23 is so tapered that as the biting projection 23 extends toward the outer periphery of the speaker 2, a width of the biting projection 23 decreases. As the biting projection 23 extends toward the other end 18*b* of the elastic part 18, namely, toward the flange 13, the width of the biting projection 23 decreases and the projection height from the elastic part 18 gradually increases.

A flat surface 25 is formed at an end of the biting projection 23 in a rear side of the insertion direction K. The flat surface 25 is formed in a direction perpendicular to the insertion direction K. When the mounting bracket 3 is attached to the speaker 2 and inserted into the hole 6, the biting projection 23 bites the inner surface 6*a* of the hole 6.

The interfering projection 24 is formed nearer the one end 18*a* than the biting projection 23 of the elastic part 18, and projects from the elastic part 18 toward the outer circumference of the speaker 2. A part of the elastic part 18 is extruded toward the outer periphery of the speaker 2 to form the interfering projection 24. In a plan view, the interfering projection 24 is formed in a round shape.

As the interfering projection 24 extends from the elastic part 18 to the outer periphery of the speaker 2, a width of the interfering projection 24 decreases. Therefore, a slant 26 is formed on an end of the interfering projection 24 in a rear side of the insertion direction K. The slant 26 is slanted in a manner that as the slant 26 extends away from the flange 13, namely, a front side of the insertion direction K, the slant 26 gradually extends toward the outer circumference of the speaker 2 against the insertion direction K. When the mounting bracket 3 is attached to the speaker 2 and inserted into the hole 6, the projection projected from the inner surface 6*a* of the hole 6 is positioned between the interfering projection 24 and the biting projection 23. Namely, the interfering projection 24 is positioned nearer the front side of the insertion direction K (deeper side of the hole 6) than the projection 7. Further, the interfering projection 24 interferes with (abuts on) the projection 7, and elastically deforms the elastic part 18 in a direction that the other end 18*b* approaches the speaker 2.

The thread 14 inserted into the hole 20 is screwed to the thread hole 15, so that the attachment 16 is overlapped with the bottom plate 11 and the mounting bracket 3 is attached to the speaker 2. Then, the mounting bracket 3 is inserted into the hole 6 in the direction of arrow K perpendicular to front surfaces of the dash boards 4, 5.

Figure 8:
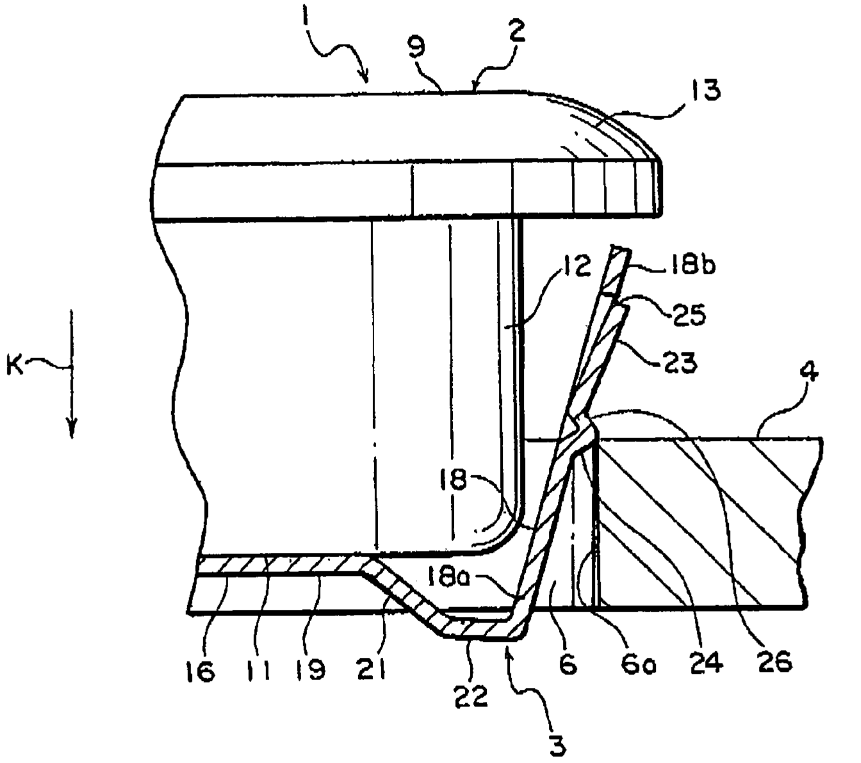
FIG. 8 is a sectional view showing the mounting bracket with the speaker inserted into a hole in the dashboard.

When the mounting bracket 3 is inserted into the hole 6 of the dashboard 4, as shown in FIG. 8, the interfering projection 24 disposed on the elastic part 18 abuts on an inner edge of the hole 6. Then, when the speaker 6 is further pushed into the hole 6, the other end 18*b* of the elastic part 18 is elastically deformed in the direction of approaching the speaker 2. Then, until the flange 13 is overlapped with the dashboard 4, the speaker is pushed into the hole 6.

Figure 6:
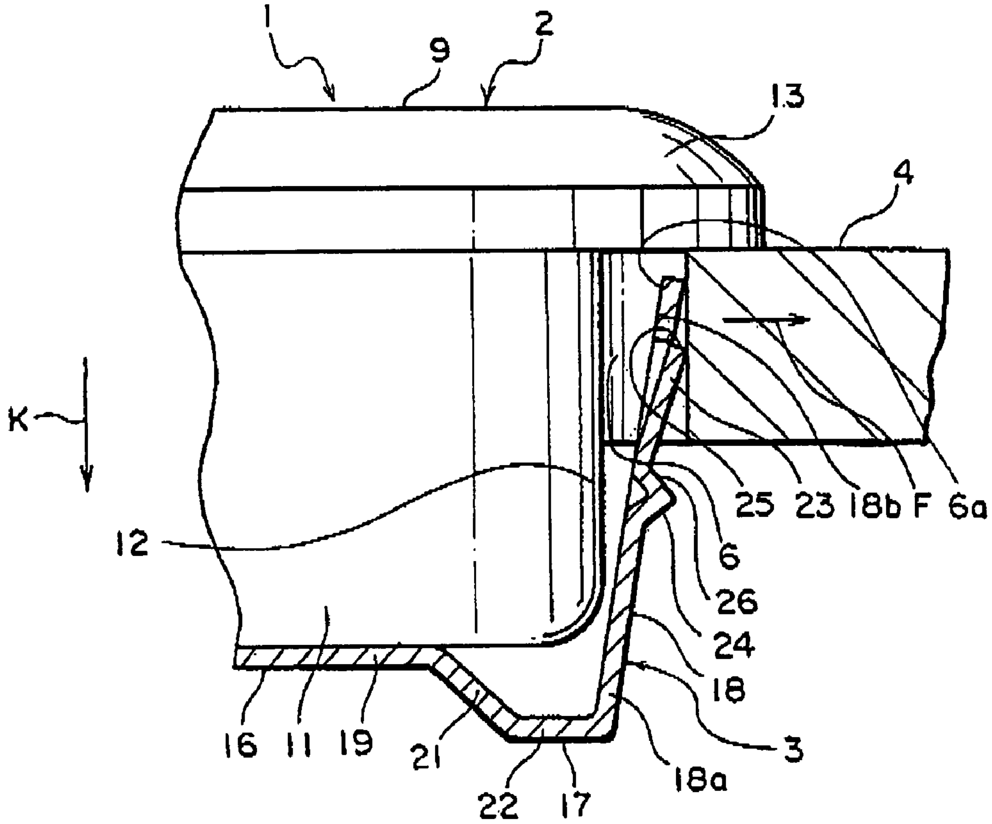
FIG. 6 is a sectional view taken on line VI-VI of FIG. 2.
Figure 7:
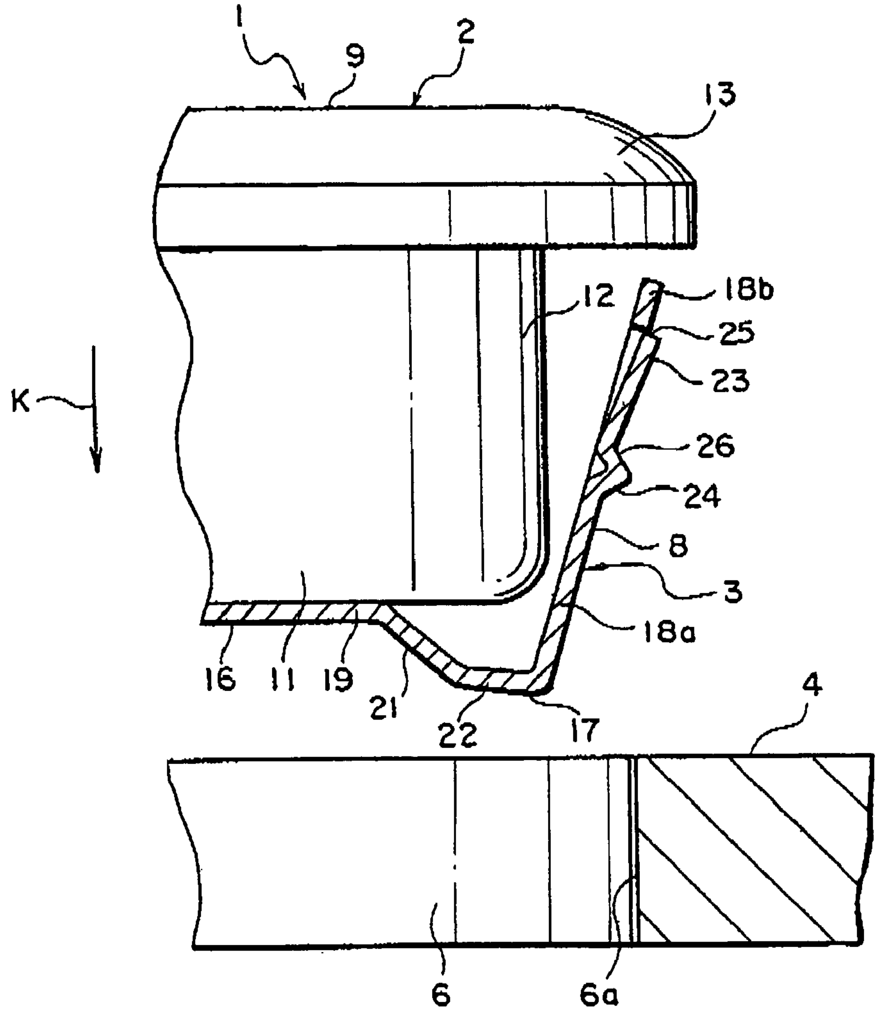
FIG. 7 is a sectional view taken on line VII-VII of FIG. 3.

Then, as shown in FIG. 6, the elastic part 18 generates a resiliency F (shown in FIG. 6) to press the inner surface 6*a* of the hole 6 toward the outer circumference of the speaker 2. Because the biting projection 23 is formed in such a shape and includes the flat surface 25, the biting projection 23 bites the inner surface 6*a* and the mounting bracket 3 axes the speaker 2 to the dashboard 4 as the structure.

Further, when the mounting bracket 3 is inserted into the hole 6 of the dashboard 5, the elastic part 18 abuts on the hole 6. Then, when the speaker 2 is further pushed into the hole 6, the other end 18*b* of the elastic part 18 is elastically deformed in the direction of approaching the speaker 2. Then, the speaker 2 is pushed into the hole 6 until the interfering projection 24 runs over the projection 7 and the flange 13 is overlapped with the dashboard 5. Then, as shown in FIG. 10, the elastic part 18 generates the resiliency F to press the inner surface 6*a* of the hole 6 toward the outer circumference of the speaker 2. Owing to the resiliency F, the slant 26 of the interfering projection 24 is tightly overlapped with the slant 8 of the projection 7.

Then, the slants 8, 26 are inclined in the direction described below and the interfering projection 24 is positioned at a front side of the insertion direction K, namely, at the deeper side of the hole 6 than the projection 7. Therefore, owing to the resiliency F, the mounting bracket 3, namely, the speaker 2 is pressed toward the front side of the insertion direction K, namely, the deeper side of the hole 6. Thus, the mounting bracket 3 fixes the speaker 2 to the dashboard 5 as the structure.

Further, the mounting bracket 3 may be attached to a cover 30 as the structure attached to the dashboard 4 of a cabin of a vehicle shown in FIGS. 11 to 14, and may be mounted on the dashboard 4 of the cabin of the vehicle through the cover 30.

As shown in FIGS. 11 to 14, the cover 30 is formed in a bowl shape. A flat surface 31 is mounted on a part of an outer surface of the cover 30. A space 33 inside a circular edge 32 of the cover 30 is a hole formed on the structure described in claims. An inner surface 33*a* of the cover 30 is an inner surface of the hole formed on the structure described in claims.

The mounting bracket 3 attached to the speaker 2 is inserted into the space 33 of the cover 30 in the direction of K (insertion direction) perpendicular to a plane formed by the edge. A plurality of positioning surfaces 34 is mounted on the inner surface 33*a* of the cover 30. The positioning surface 34 projects from the inner surface 33*a* of the cover 30.

The positioning surfaces 34 are arranged on the edge 32 of the cover in a circumferential direction and spaced to each other. The positioning surface 34 extends straightly from the edge 32 of the cover 30 towards a deeper side of the cover 30 in the insertion direction K. The projection 7 projected from the inner surface 33*a* is formed between some of the positioning surface 34 next to each other. A structure and a function of the projection 7 are the same as those of the projection 7 described above, therefore, same reference numeral is used, and an explanation thereof is omitted.

A hole penetrating the flat surface 31 is formed on the cover 30. Bolts or the like for fixing the cover to the dashboard 4 is inserted into this hole. The flat surface 31 is overlapped with the dashboard 4, and the cover 30 is fixed to the dashboard 4 by the bolts or the like inserted into the hole.

Figure 13:
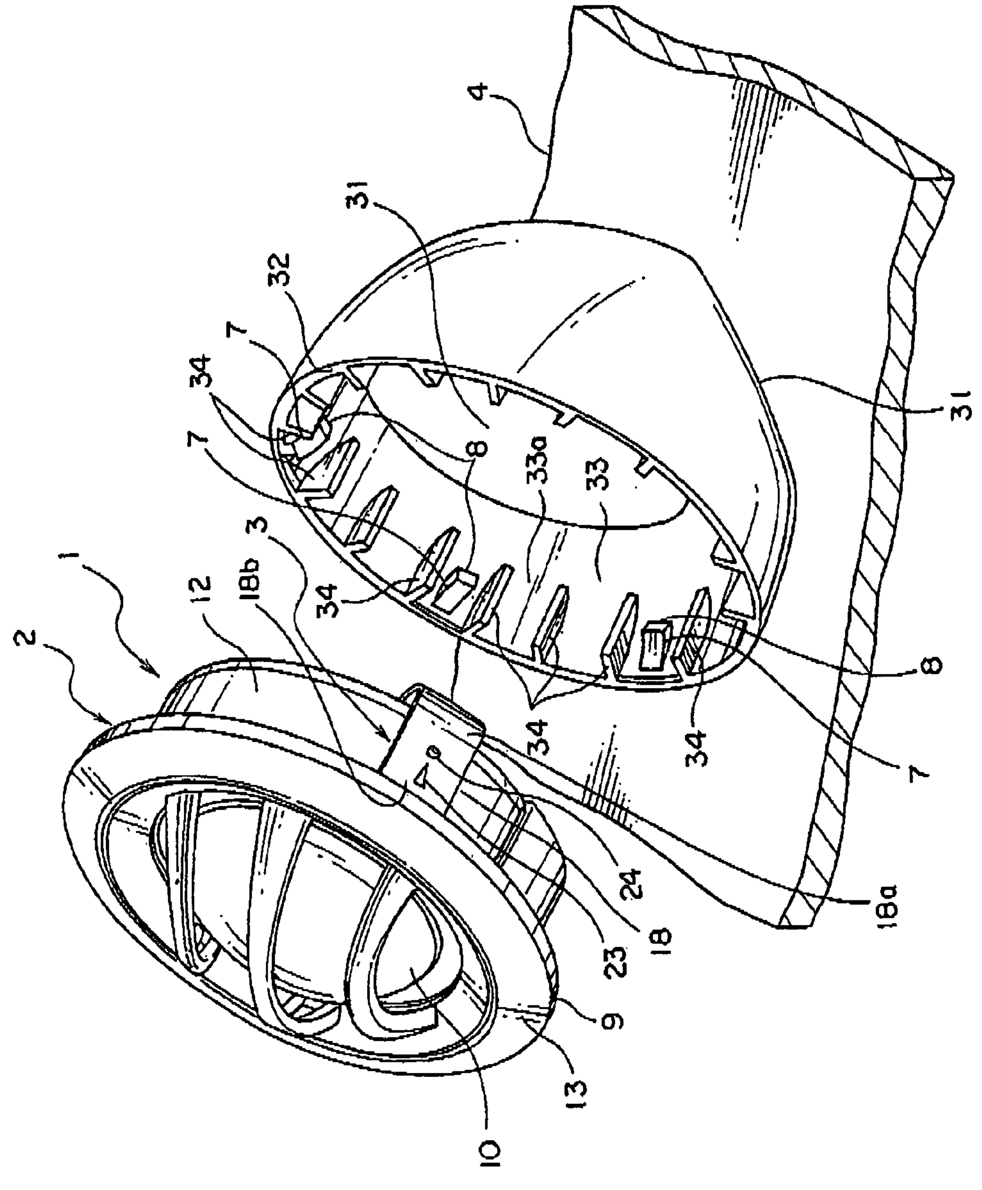
FIG. 13 is an exploded perspective view showing the speaker of FIG. 11 and the cover.
Figure 14:
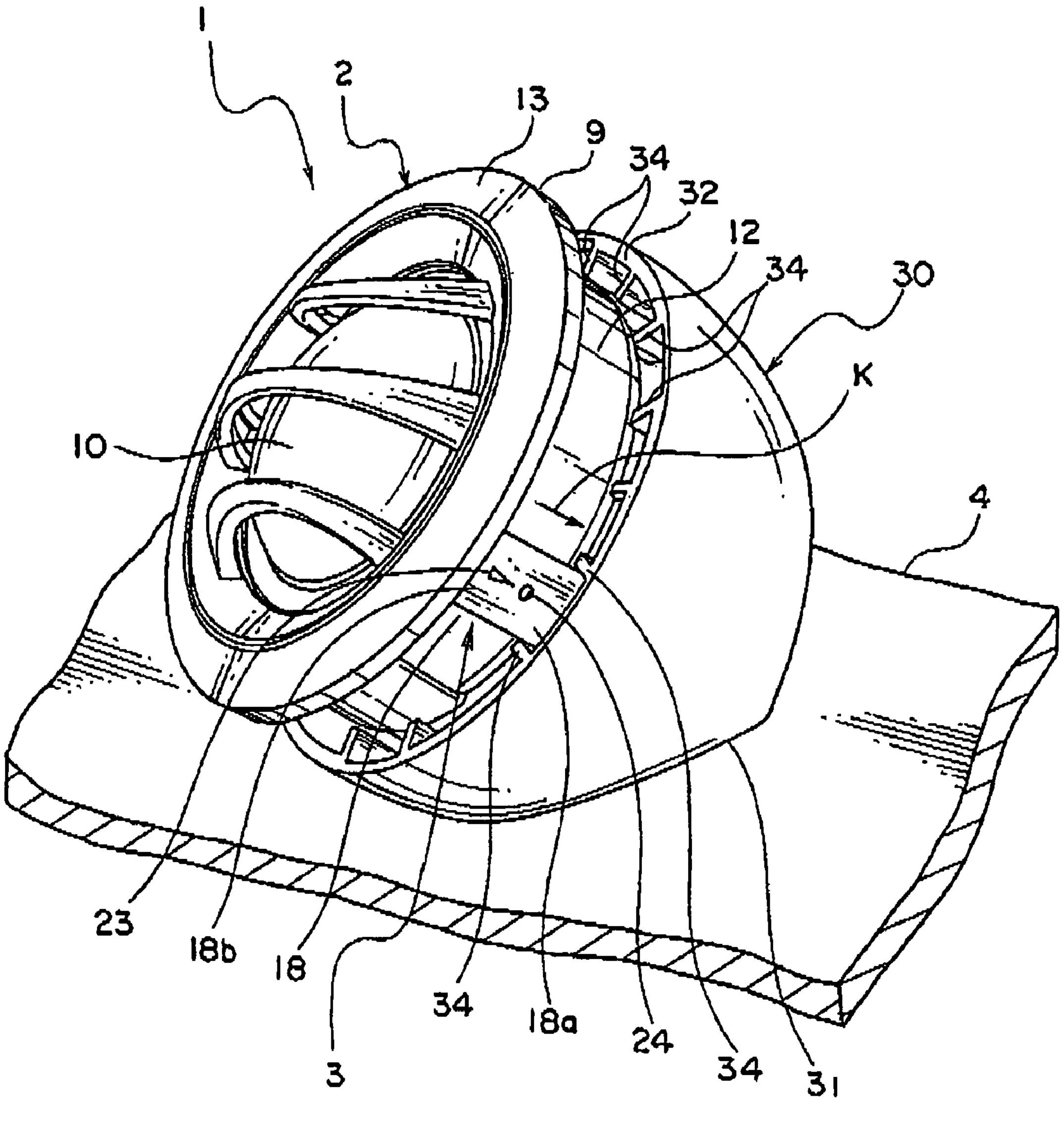
FIG. 14 is a perspective view showing the speaker of FIG. 13 inserted into the cover.
Figure 15:
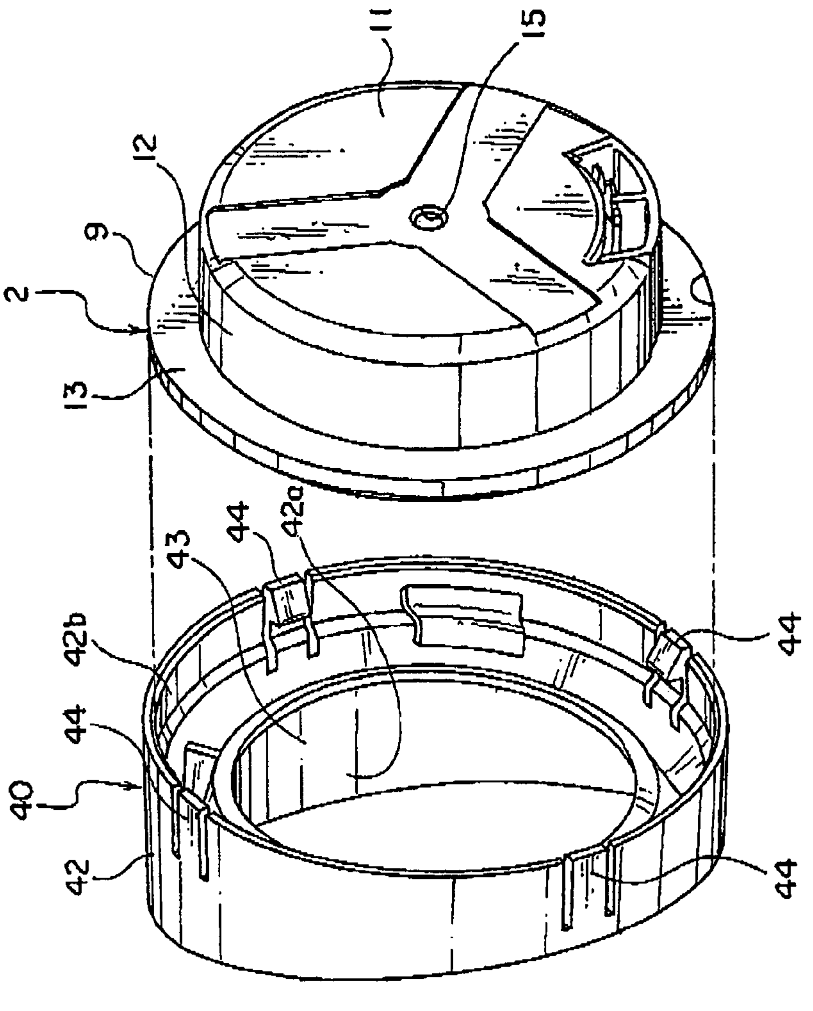
FIG. 15 is a perspective view showing the speaker and a spacer shown in FIG. 1.
Figure 16:
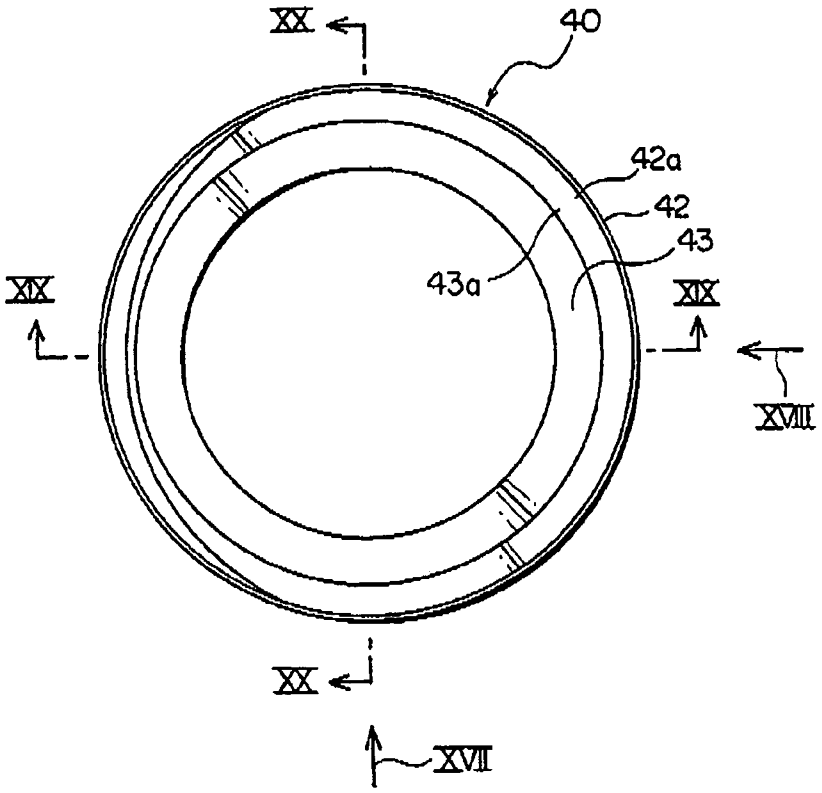
FIG. 16 is a plan view showing the spacer of FIG. 15.
Figure 17:
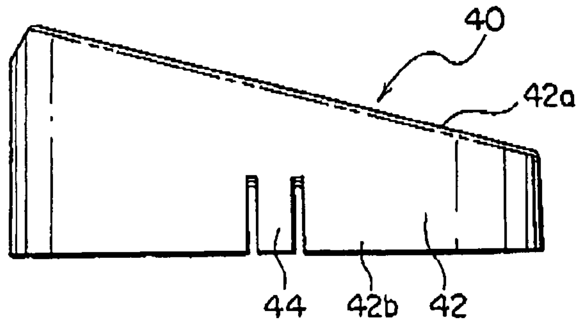
FIG. 17 is a side view showing the spacer from XVII of FIG. 16.
Figure 18:
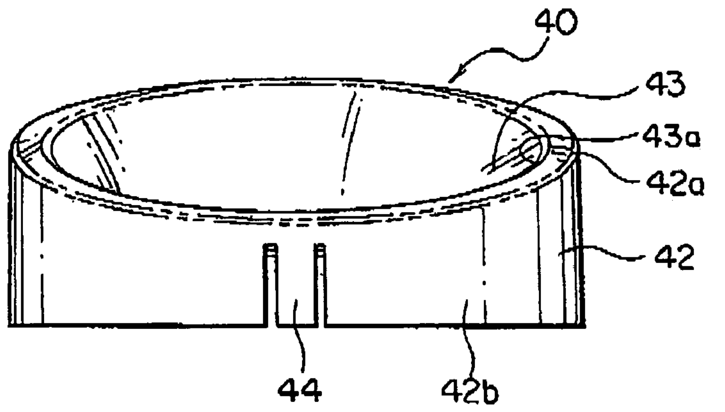
FIG. 18 is a side view showing the spacer from XVIII of FIG. 17.
Figure 19:
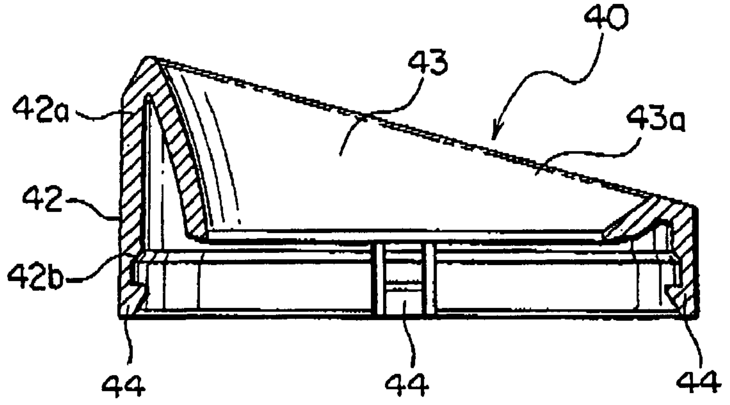
FIG. 19 is a sectional view taken on line XIX-XIX of FIG. 16.
Figure 20:
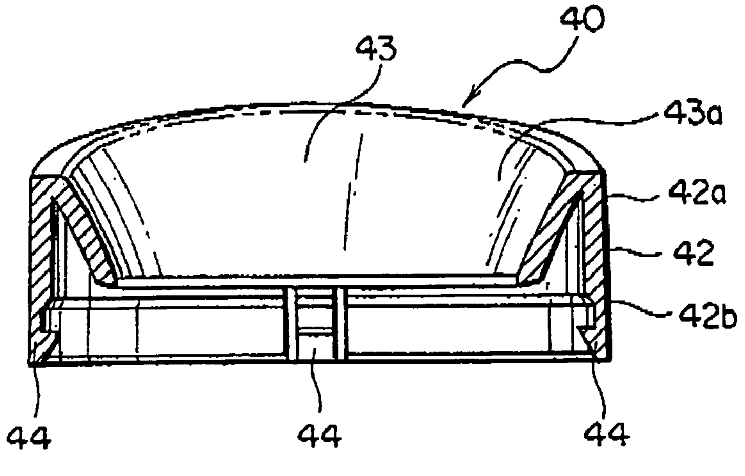
FIG. 20 is a sectional view taken on line XX-XX of FIG. 16.

When the speaker 2 is attached to the cover 30, firstly, as shown in FIG. 13, the speaker 2, the mounting bracket 3, and the cover 30 are positioned on a place where the projections 7 and the interfering projections 24 are disposed in the insertion direction K. Then, as shown in FIG. 14, the mounting bracket 3 attached to the speaker 2 is gradually inserted into an inside of the cover 30. Then, the mounting bracket 3 is pushed into the inside of the cover until the interfering projections 24 runs over the projections 7 against the resiliency of the elastic part 18.

Figure 11:
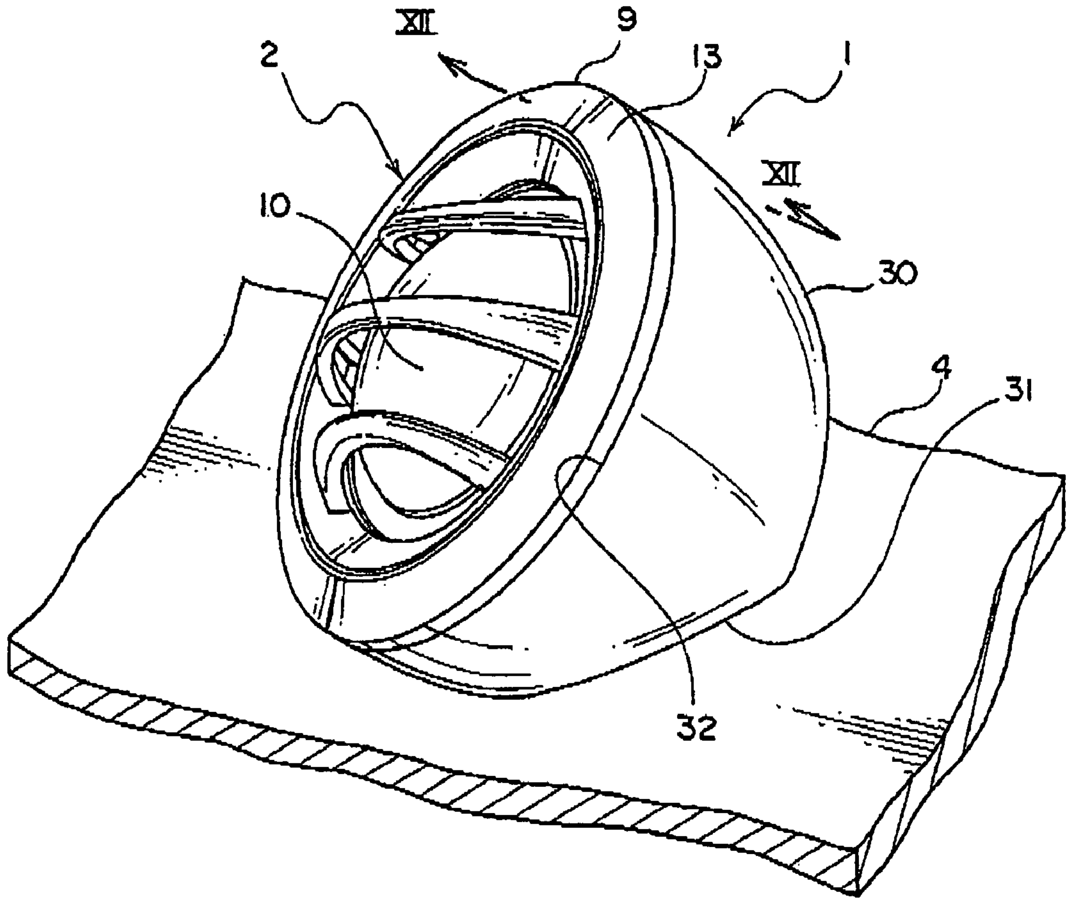
FIG. 11 is a perspective view showing the speaker of FIG. 2 mounted on the dashboard through a cover.
Figure 12:
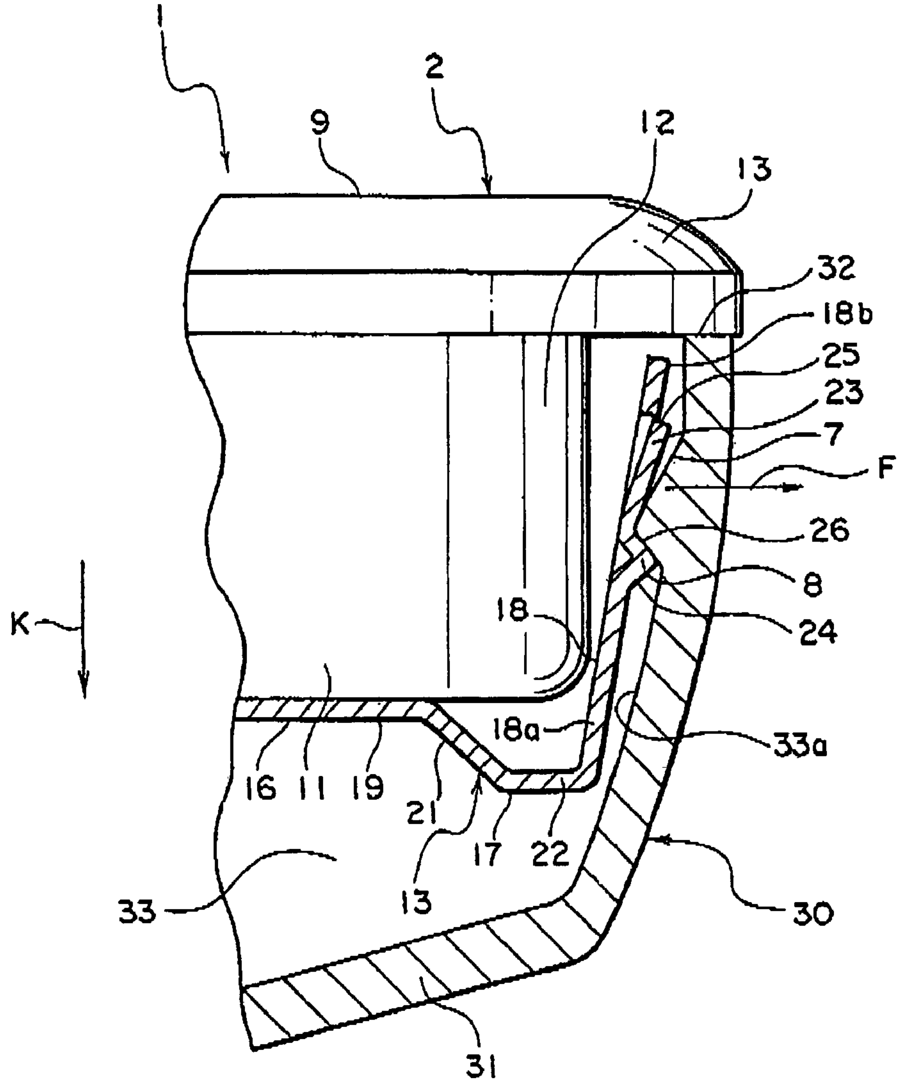
FIG. 12 is a sectional view taken on line XII-XII of FIG. 11.

Then, as shown in FIG. 12, the interfering projection 24 is positioned at the front side of the insertion direction K, namely, a deeper side of the space 33 of the cover 30 than the projection 7. Thus, as shown in FIG. 11, the speaker 2 is attached to the cover 30. As shown in FIG. 12, mainly the elastic part 18 of the mounting bracket 3 generates the resiliency to press the inner surface 33*a* of the cover 30 toward the outer circumference of the speaker 2 so that the speaker 2 is attached to the cover 30.

According to the present embodiment, because the mounting bracket 3 includes the biting projection 23 projecting from the elastic part 18 for biting the inner surface 6*a* of the hole 6, when the mounting bracket 3 is attached to the speaker 2 and inserted into the hole 6, the biting projection 23 bites the inner surface 6*a* of the hole 6 and the speaker 2 is mounted on the dashboard 4 as the structure.

Further, because the interfering projection 24 formed on the elastic part 18 is disposed at the deeper side than the projection 7 formed on the inner surface 6*a* of the hole 6 and the inner surface 33*a* of the cover 30, when the other ends 18*b* of the elastic part 18 positioned on the hole 6 and the cover 30 is elastically deformed in the direction of approaching the speaker 2, owing to the resiliency of the elastic part 18, the speaker 2 is pressed toward the hole 6 and the deep side of the cover 30.

Thus, when the mounting bracket 3 attached to the speaker 2 is inserted into the hole 6, the interfering projection 24 bites the inner surface 6*a* of the hole 6 or the interfering projection 24 is disposed on the deeper side than the projection 7 of the inner surface 6*a*, 33*a* of the cover 30. Therefore, because the mounting bracket 3 is inserted into the hole 6 while being attached to the speaker 2, the mounting bracket 3 can attach the speaker 2 to the dashboard 4 or the cover 30.

Because the speaker 2 can be attached to the dashboard 4 having no projection 7 on the inner surface 6*a* of the hole 6, the dashboard 5 having the projection 7 on the inner surface 6*a* of the hole 6, and the cover 30 having the projection 7 on the inner surface 33*a*, the speaker 2 can be attached to a variety of structures without increasing a variety of the mounting bracket 3.

The width of the biting projection 23 is gradually reduced as the biting projection 23 extends toward the outer circumference of the speaker 2. Therefore, the biting projection 23 surely bites the inner surface 6*a* of the hole 6, and the speaker 2 is surely mounted on the dashboard 4.

The flat surface 25 is formed on the rear end of the insertion direction K to the hole 6, the flat surface 25 is perpendicular to the insertion direction K. Therefore, when the mounting bracket 3 is once inserted into the hole 6, the flat surface 25 catches the inner surface 6*a* of the hole 6 so that the speaker 2 is surely prevented from falling out of the hole 6, namely, the dashboard 4.

A width of the interfering projection 24 gradually decreases as the interfering projection 24 extends toward the outer circumference of the speaker 2. Therefore, the slant 26 abutting on the projection 7 of the interfering projection 24 is inclined toward the outer periphery of the speaker 2 as the slant 26 extends toward the front side of the insertion direction K. Therefore, the resiliency F of the elastic part 18 elastically deformed toward the speaker 2 surely presses the speaker 2 toward the hole 6 and the deep side of the cover 30. Therefore, the speaker 2 is prevented from falling out from the structure.

The connecting part 17 connecting the attachment 16 to the speaker 2 and the elastic part 18 is mounted on the mounting bracket 3. The first extending part 21 extending from the attachment 16 toward the front side of the insertion direction K, and the second extending part 22 extending from the first extending part 21 to the outer periphery of the speaker 2 is mounted on the connecting part 17. Thus, the connecting part 17 allowing the elastic part 18 to be deformed includes the first extending part 21 and the second extending part 22, so that a total length of the connecting part 17 is long.

Therefore, in comparison with a case that the attachment 16 is directly connected to the elastic part 18, because the total length of the connecting part 17 is long, even when the elastic part 18 has less deformation, the resiliency of the elastic part 18 is surely attained. Therefore, the elastic part 18 surely presses the speaker 2 in the insertion direction K, so that the speaker 2 is surely prevented from falling out of the structure.

A plurality of elastic parts 8 may be formed in the circumferential direction of the speaker 2. In this case, the biting projection 23 and the interfering projection 24 may be provided on the circumferential direction of the speaker 2. Therefore, a plurality of biting positions for the interfering projection 24 and the biting projection 23 can be provided on the circumferential direction of the inner surface 6*a* of the hole 6, so that the speaker 2 is further prevented from falling out of the hole 6.

A plurality of the resiliency F caused by the interference between the interfering projection 24 and the projection 7, namely, a pressing force to press the speaker 2 toward the front side of the insertion direction K is arranged in the circumferential direction of the speaker 2, the speaker 2 is further prevented from falling out of the hole 6.

The speaker unit 1 includes the speaker 2 and the mounting bracket 3. Therefore, the speaker unit 1 easily mounts the speaker 2 on the structure, and the speaker 2 is prevented from falling out of the structure.

The speaker 2 of the speaker unit 1 may be mounted on the dashboard 4 as the structure in a cabin of a vehicle without the mounting bracket 3 and with a spacer 40 as shown in FIGS. 15 to 20. A dent 41 is formed on the dashboard 4. The dent 41 is a circle in a plan view. An axis of the dent 41 is inclined to the direction perpendicular to the surface of the dashboard 4.

As shown in FIGS. 15 to 20, the spacer 40 includes an outer tube 42 and an inner tube 43 integrally and is formed in a ring shape. Each of the outer tube 42 and the inner tube 43 is formed in an obliquely cut ring shape. An inner diameter of the outer tube 42 is larger than an outer diameter of the inner tube 43. The outer tube 42 and the inner tube 43 are arranged coaxially. The outer tube 42 and the inner tube 43 are crossed to the direction of the axis of the tubes 42, 43. Edge parts 42*a*, 43*a* are linked with each other, both edge parts forms an acute angle with the axis.

Inner and outer diameter of the outer tube 42 is constant in the axis direction. Inner and outer diameter of the inner tube 43 is gradually reduced as the inner tube 43 extends away from the edge 42*a*. A plurality of locking claws 44 for the flange 13 of the speaker 2 are formed on the other edge 42*b* of the outer tube 42. The locking claws 44 are arranged at even intervals in the circumferential direction of the spacer 40.

The locking claws 44 lock the flange 13 so that the spacer 40 is attached to the speaker 2. Then, the speaker 2 and the spacer 40 are arranged coaxially. Then, the spacer 40 and the speaker 2 are inserted into the dent 41 and mounted on the dashboard 4.

Figure 21:
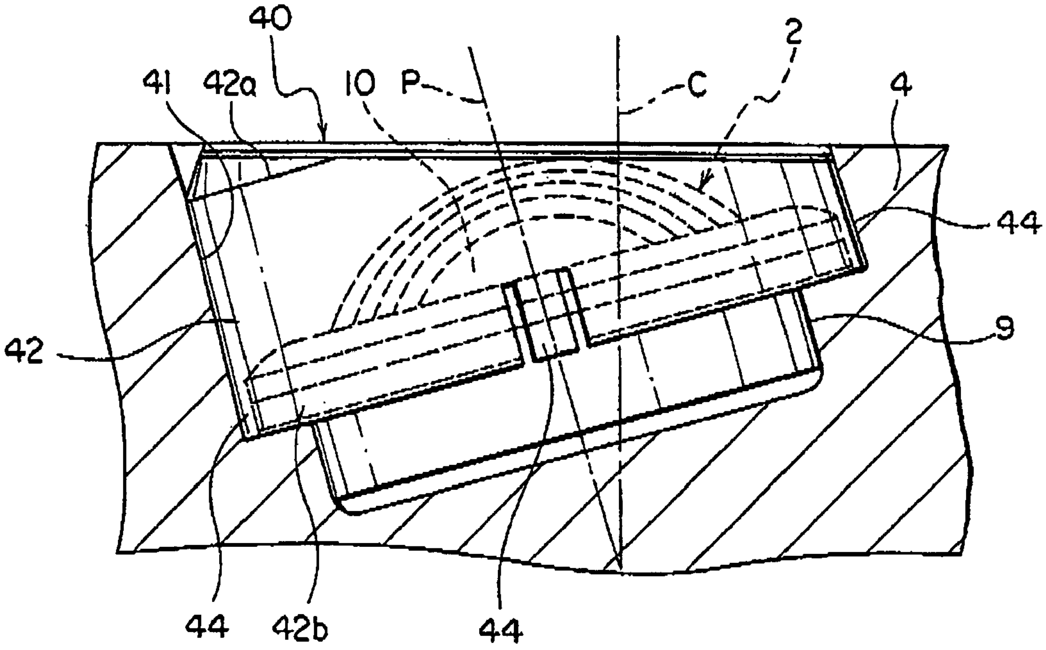
FIG. 21 is a sectional view showing the speaker and the spacer shown in FIG. 16 mounted on the dashboard.

As shown in FIG. 21, when the spacer 40 is mounted on the dashboard 4, the edges 42*a*, 43*a* are arranged in the same plane with the front surface of the dashboard 4. Thus, the spacer 40 mounts the speaker 2 on the dashboard 4 in a state that an axis P is crossed to a direction C perpendicular to the front surface of the dashboard 4. Thus, the edges 42*a*, 43*a* having different directions are mounted, and one of them is optionally used so that the direction of the axis P of the speaker 2 is optionally selected, and directivity of the speaker 2 is optionally selected to attain an optimized acoustic characteristics.

In the embodiment described above, three elastic parts 18 are used. However, according to the present invention, two elastic parts 18 may be used. In this case, when the mounting bracket 3 is formed by stamping a metal plate, an yield of the material can be improved. When two elastic parts 18 are formed, the elastic parts 18 axe preferably disposed at positions including the one end of the straight plate 19.

According to the present invention, the elastic part 18 is preferably disposed at even intervals on the circumferential direction of the speaker 2. Further, according to the present invention, one elastic part 18 or four elastic parts 18 can be used. In short, the number of the elastic part 18 has no limit.

In the embodiment described above, the dashboard 4 of a vehicle or the cover 30 is used as the structure. However, according to the present invention, the speaker 2 can be mounted on the other structure than the dashboard 4 of a vehicle. Of course, according to the present invention, the speaker 2 can be mounted on the various structures except a vehicle.

According to the embodiment described above, the mounting bracket 3 is attained below.

Note

A mounting bracket 3 attached to the speaker 2, and inserted into the hole 6, 33 with the speaker 2, including:

an elastic part 18 for generating resiliency F in a direction of expanding an inner surface 6*a*, 33*a* of the hole 6, 33 when the elastic part 18 is inserted into the hole 6, 33;

a biting projection 23 projecting from the elastic part 18 for biting the inner surface 6*a*, 33*a* of the hole 6, 33;

an interfering projection 24 projecting from the elastic part 18 to be disposed on a position at a deeper side of the hole 6, 33 than a projection 7 formed on the inner surface 6*a*, 33*a* of the hole 6, 33 for interfering with the projection 7.

According to the note, because the mounting bracket 3 includes the biting projection 23 projecting from the elastic part 18 for biting the inner surface 6*a* of the hole 6, when the mounting bracket 3 is attached to the speaker 2 and inserted into the hole 6, the biting projection 23 bites the inner surface 6*a* of the hole 6 to mount the speaker 2 on the structure.

Further, because the interfering projection 24 projecting from the elastic part 18 is disposed on the position at the deeper side of the hole 6, 33 than a projection 7 formed on the inner surface 6*a*, 33*a* of the hole 6, 33, when the other end 18*b* of the elastic part 18 positioned on the hole 6, 33 is elastically deformed in the direction of approaching the speaker 2, owing to the resiliency F of the elastic part 18, the speaker 2 is pressed into the deep side of the hole 6,33.

Thus, when the mounting bracket 3 is attached to the speaker 2 and inserted into the hole 6, 33, the biting projection 23 bites the inner surface 6*a* of the hole 6, or the interfering projection 24 is disposed at the deeper side than the projection 7 formed on the inner surface 6*a*, 33*a* of the hole 6, 33. Thus, the speaker 2 is mounted on the structure 4, 5, 30.

Further, because the mounting bracket 3 can be attached to both the structure 4 having no projection 7 on the inner surface 6*a* of the hole 6, and the structure 5, 30 having the projection 7 on the inner surface 6*a* of the hole 6, the mounting bracket 3 can mount the speaker 2 on various structures 4, 5, 30 without increasing the variety of the mounting bracket 3.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A mounting bracket to be attached to a speaker, and inserted into a hole with the speaker for mounting the speaker on a structure, said mounting bracket comprising:

a plurality of elastic members each having substantially a plane wall to make resiliency act in a direction of expanding an inner surface of the hole when each elastic member is inserted into the hole, wherein each elastic member at least includes: a first projection disposed on the plane wall and projected toward an inner surface of the hole; and a second projection disposed on the same plane wall as the first projection, of which shape is different from that of the first projection toward the inner surface of the hole, wherein the first projection is a biting projection to bite the inner surface of the hole, and wherein a width of the biting projection gradually decreases as the biting projection extends from the elastic part to an outer circumference of the speaker.

2. The mounting bracket as claimed in claim 1, wherein the biting projection includes a flat surface formed perpendicular to an insertion direction of the speaker at an end positioned at a rear side of the insertion direction of inserting the speaker into the hole.

3. The mounting bracket as claimed in claim 1, further comprising:

an attachment to be overlapped with the speaker and attached to the speaker, and a connection for connecting the attachment and the elastic part, wherein the connecting part includes a first connecting part extending from the attachment and away from the speaker in a direction of inserting the speaker into the hole and a second connecting part extending from the first extending part toward the outer periphery of the speaker, and linked with the elastic part.

4. A mounting bracket to be attached to a speaker, and inserted into a hole with the speaker for mounting the speaker on a structure, said mounting bracket comprising:

a plurality of elastic members each having substantially a plane wall to make resiliency act in a direction of expanding an inner surface of the hole when each elastic member is inserted into the hole, wherein each elastic member at least includes: a first projection disposed on the plane wall and projected toward an inner surface of the hole; and a second projection disposed on the same plane wall as the first projection, of which shape is different from that of the first projection projected toward the inner surface of the hole, wherein the second projection is an interfering projection disposed at a deeper side in the hole than the projection disposed on the inner surface of the hole to interfere with the projection, and wherein a width of the interfering projection gradually decreases as the interfering projection extends from the elastic part to the outer circumference of the speaker.

5. The mounting bracket as claimed in claim 4, wherein the interfering projection includes a slant surface formed in a direction crossing to the insertion direction at the end positioned at the rear side of the insertion direction of inserting the speaker into the hole, disposed in a direction toward the outer periphery of the speaker as the slant surface extends in the deeper side of the hole.

6. The mounting bracket as claimed in claim 4, further comprising:

an attachment to be overlapped with the speaker and attached to the speaker, and a connection for connecting the attachment and the elastic part, wherein the connecting part includes a first connecting part extending from the attachment and away from the speaker in a direction of inserting the speaker into the hole and a second connecting part extending form the first extending part toward the outer periphery of the speaker, and linked with the elastic part.

7. A speaker unit comprising:

a speaker; and the mounting bracket as claimed in any one of claims 1, 2, 3, 4, 5 and 6.

* * * * *